United States Patent
Ishihara et al.

(10) Patent No.: US 9,844,151 B2
(45) Date of Patent: Dec. 12, 2017

(54) METHOD FOR MANUFACTURING COMBINED WIRING BOARD

(71) Applicant: IBIDEN CO., LTD., Ogaki-shi (JP)

(72) Inventors: Teruyuki Ishihara, Ogaki (JP); Michimasa Takahashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 217 days.

(21) Appl. No.: 14/492,424

(22) Filed: Sep. 22, 2014

(65) Prior Publication Data

US 2015/0085461 A1 Mar. 26, 2015

(30) Foreign Application Priority Data

Sep. 20, 2013 (JP) ................................ 2013-195027

(51) Int. Cl.
*H05K 3/36* (2006.01)
*H05K 3/00* (2006.01)

(52) U.S. Cl.
CPC .......... *H05K 3/368* (2013.01); *H05K 3/0097* (2013.01); *H05K 2201/10598* (2013.01); *H05K 2201/2018* (2013.01); *H05K 2203/0152* (2013.01); *H05K 2203/1484* (2013.01); *Y10T 29/49126* (2015.01)

(58) Field of Classification Search
CPC ... H05K 2203/0152; H05K 2203/0165; H05K 2203/0169; H05K 3/0097; H05K 3/368; H05K 2203/1484; H05K 2201/2018; H05K 2201/10598; Y10T 29/48126
See application file for complete search history.

(56) References Cited

U.S. PATENT DOCUMENTS

| | | |
|---|---|---|
| 2014/0131074 A1 | 5/2014 | Ishihara et al. |
| 2014/0133110 A1 | 5/2014 | Takahashi et al. |
| 2014/0133111 A1 | 5/2014 | Ishihara et al. |

FOREIGN PATENT DOCUMENTS

| | | | | |
|---|---|---|---|---|
| JP | WO 2007010595 A1 * | 1/2007 | ............ | H01L 23/13 |
| JP | 2011-023657 A | 2/2011 | | |

OTHER PUBLICATIONS

U.S. Appl. No. 14/496,028, filed Sep. 25, 2014, Ishihara, et al.
U.S. Appl. No. 14/465,127, filed Aug. 21, 2014, Ishihara, et al.

\* cited by examiner

*Primary Examiner* — Livius R Cazan
(74) *Attorney, Agent, or Firm* — Oblon, McClelland, Maier & Neustadt, L.L.P.

(57) ABSTRACT

A method for manufacturing a combined wiring board includes preparing multiple wiring boards, preparing a metal frame having opening portions which accommodate the boards, respectively, positioning the boards in the opening portions of the frame, respectively, and forming multiple crimped portions in the frame by plastic deformation such that the sidewalls of the boards bond to sidewalls of the opening portions in the frame. The preparing of the boards includes forming the sidewalls of the boards such that when the boards are positioned in the opening portions of the frame, the sidewalls of the boards form wide-space portions and narrow-space portions with respect to the sidewalls of the opening portions in the frame, and the forming of the crimped portions includes generating the deformation such that the sidewalls of the opening portions in the frame abut the narrow-space portions of the boards before the wide-space portions of the boards.

14 Claims, 15 Drawing Sheets

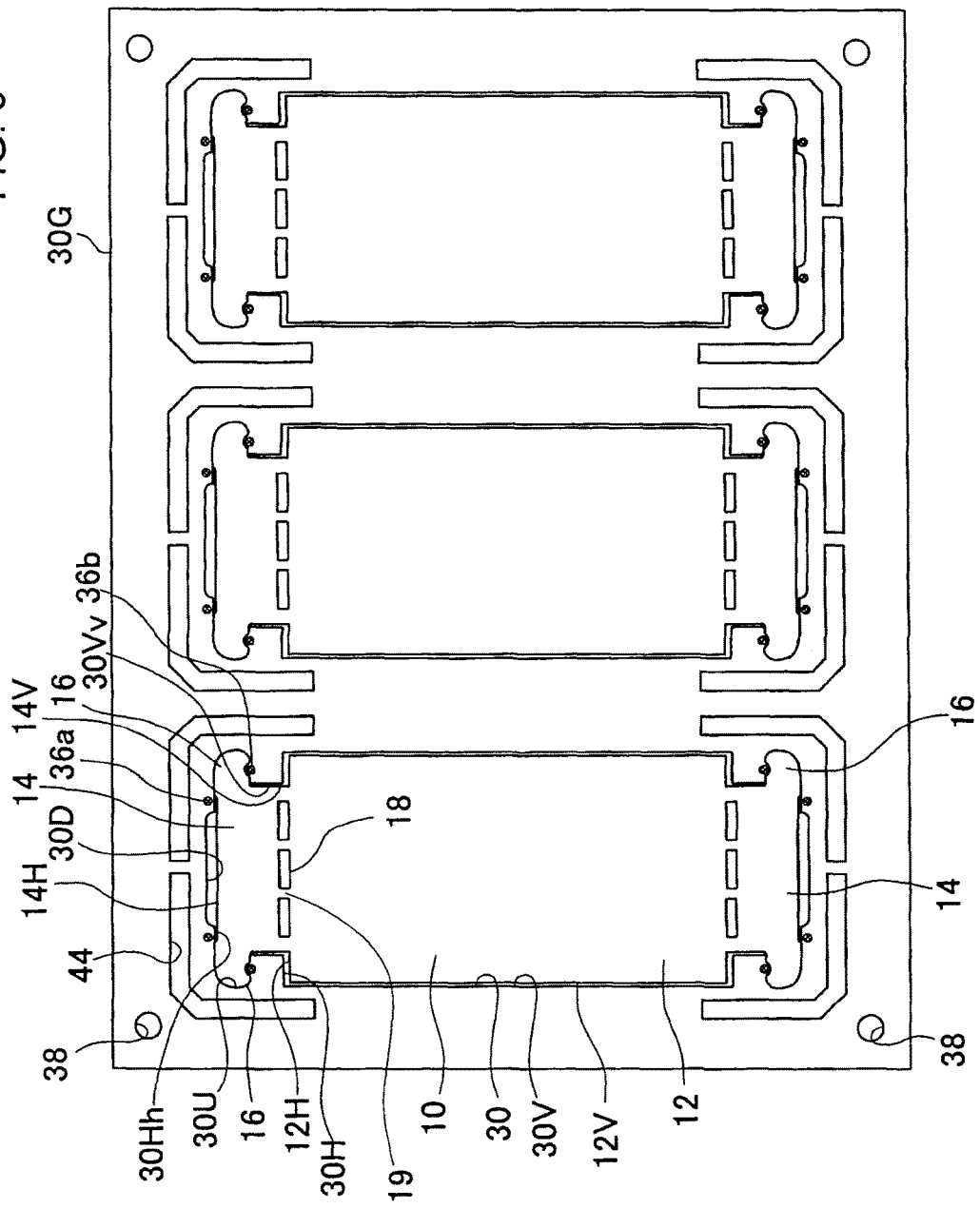

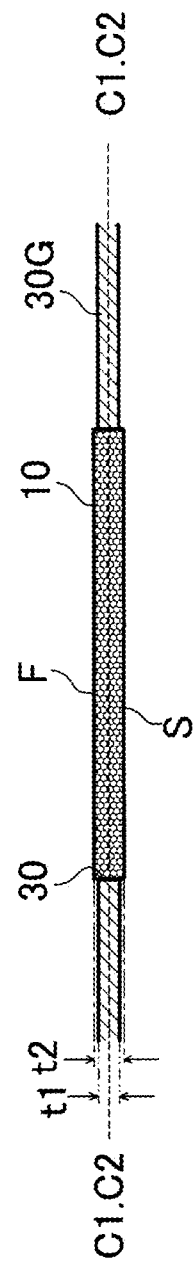
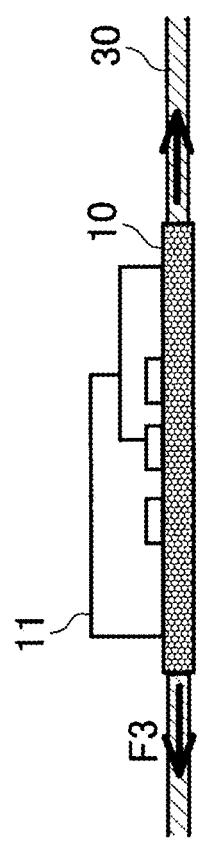

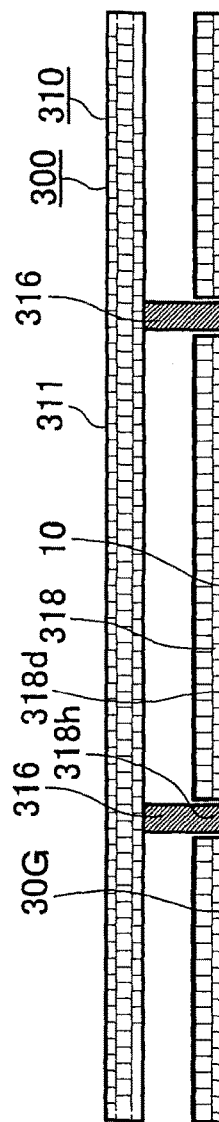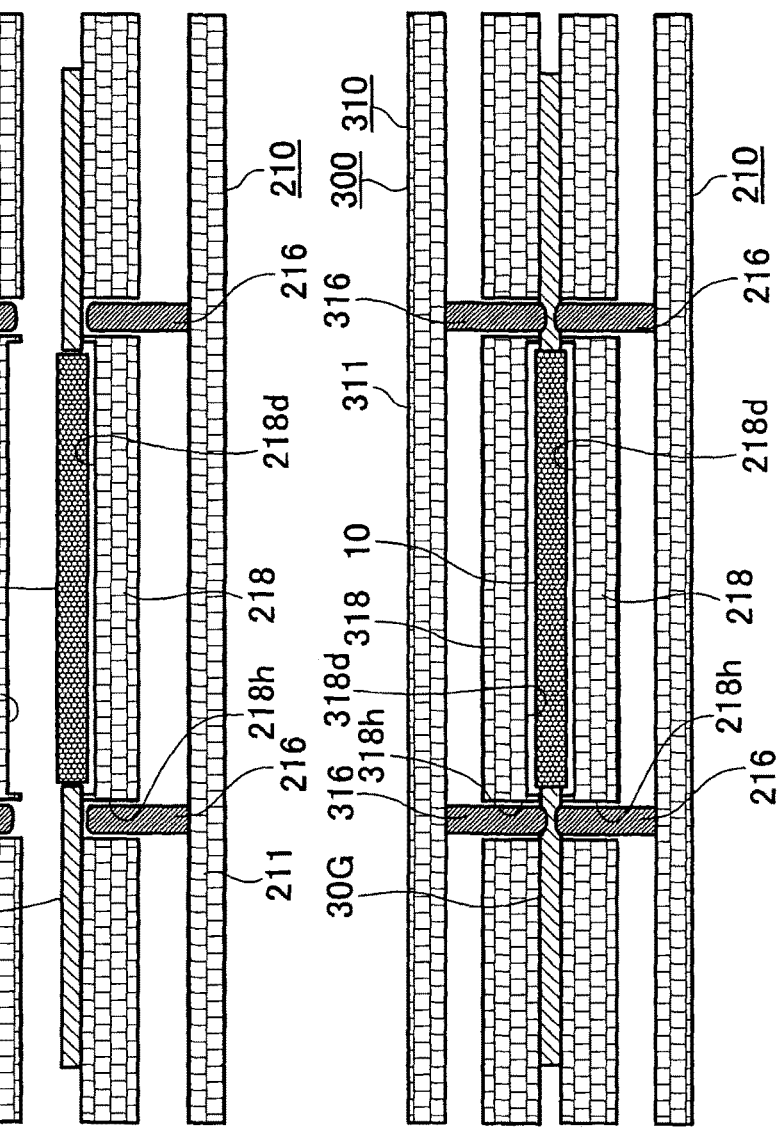
FIG. 9(A)
FIG. 9(B)

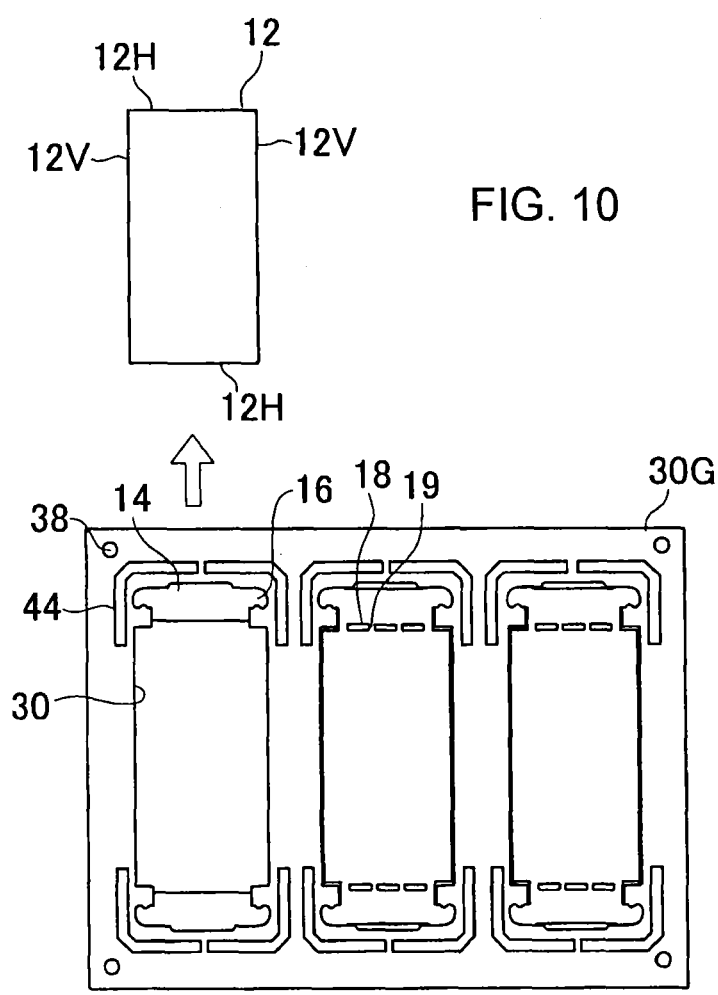

METHOD FOR MANUFACTURING COMBINED WIRING BOARD

CROSS-REFERENCE TO RELATED APPLICATIONS

The present application is based upon and claims the benefit of priority to Japanese Patent Application No. 2013-195027, filed Sep. 20, 2013, the entire contents of which are incorporated herein by reference.

BACKGROUND OF THE INVENTION

Field of the Invention

The present invention relates to a combined wiring board where wiring boards to be reflowed are fixed to a frame, and to a method for manufacturing such a combined wiring board.

Description of Background Art

When mounting an electronic component on a wiring board and conducting other procedures on the wiring board, such procedures may be performed not on one single wiring board but on multiple identical wiring boards accommodated in an accommodation kit to enhance manufacturing efficiency. JP2011-23657A describes a multipiece wiring-board accommodation kit made up of multiple piece wiring boards and a frame having accommodation holes to accommodate those piece wiring boards. The entire contents of this publication are incorporated herein by reference.

SUMMARY OF THE INVENTION

According to one aspect of the present invention, a method for manufacturing a combined wiring board includes preparing multiple wiring boards, preparing a metal frame having opening portions which accommodate the wiring boards, respectively, positioning the wiring boards in the opening portions of the metal frame, respectively, and forming multiple crimped portions in the metal frame by plastic deformation such that the sidewalls of the wiring boards bond to sidewalls of the opening portions in the metal frame. The preparing of the wiring boards includes forming the sidewalls of the wiring boards such that when the wiring boards are positioned in the opening portions of the metal frame, the sidewalls of the wiring boards form wide-space portions and narrow-space portions with respect to the sidewalls of the opening portions in the metal frame, and the forming of the crimped portions includes generating the plastic deformation such that the sidewalls of the opening portions in the metal frame abut the narrow-space portions of the sidewalls of the wiring boards before the wide-space portions of the sidewalls of the wiring boards.

According to another aspect of the present invention, a combined wiring board includes a metal frame having opening portions, and multiple wiring boards positioned in the opening portions in the metal frame, respectively. The metal frame has multiple crimped portions formed by plastic deformation such that sidewalls of the wiring boards are bonding to sidewalls of the opening portions in the metal frame to fix the wiring boards in the opening portions in the metal frame, and the sidewalls of the wiring boards have arc shaped portions which are recessed toward the wiring boards.

According to yet another aspect of the present invention, a combined wiring board includes a metal frame having opening portions, and multiple wiring boards positioned in the opening portions in the metal frame, respectively. The metal frame has multiple crimped portions formed by plastic deformation such that sidewalls of the wiring boards are bonding to sidewalls of the opening portions in the metal frame to fix the wiring boards in the opening portions in the metal frame, the sidewalls of the wiring boards have arc shaped portions which are recessed toward the wiring boards and are abutting the sidewalls of the opening portions of the metal frame, and the sidewalls of the metal frame have linear portions abutting linear portions of the sidewalls of the wiring boards adjacent to the arc-shaped portions.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is a plan view of crimp-processed printed wiring boards;

FIGS. 8(A) and 8(B) show cross-sectional views of a combined wiring board;

FIGS. 9(A) and 9(B) show cross-sectional views of a crimping tool in a first embodiment;

FIG. 10 is a plan view of a printed wiring board cut out from the combined wiring board;

DETAILED DESCRIPTION OF THE EMBODIMENTS

Figure 1:
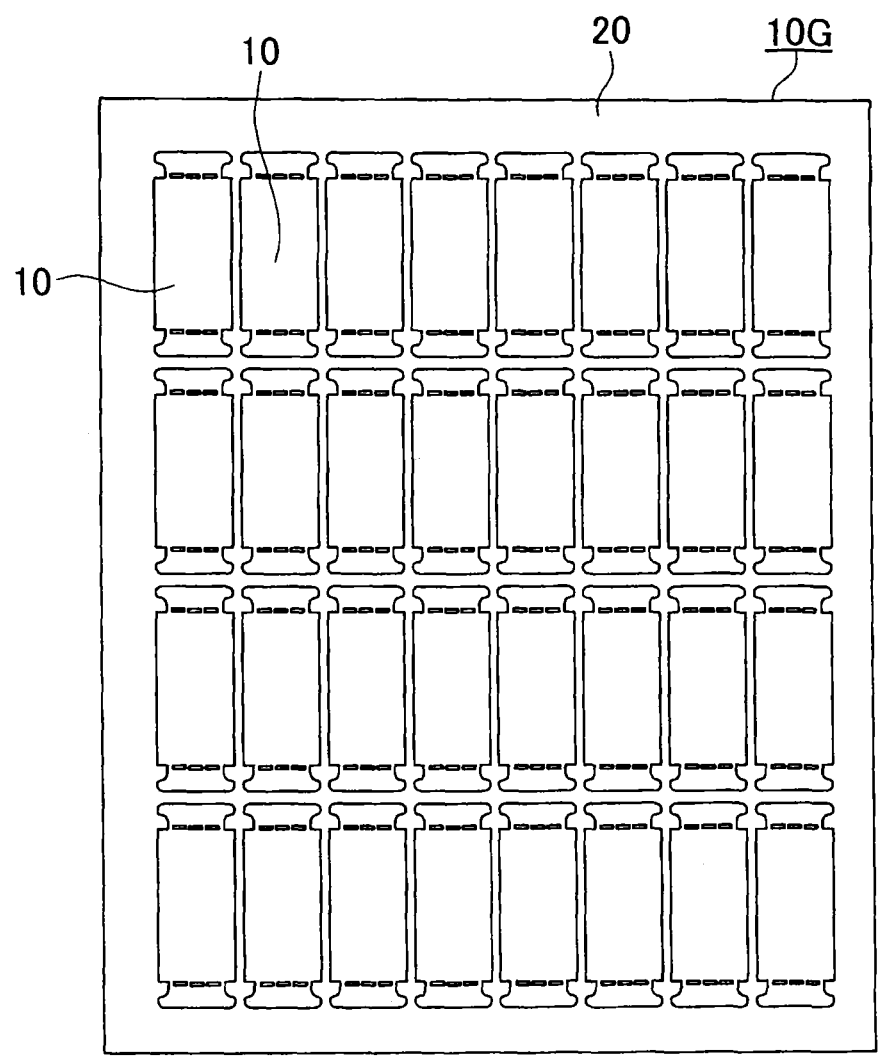
FIG. 1 is a plan view of a multipiece printed wiring board.

The embodiments will now be described with reference to the accompanying drawings, wherein like reference numerals designate corresponding or identical elements throughout the various drawings.

First Embodiment

Figure 11:
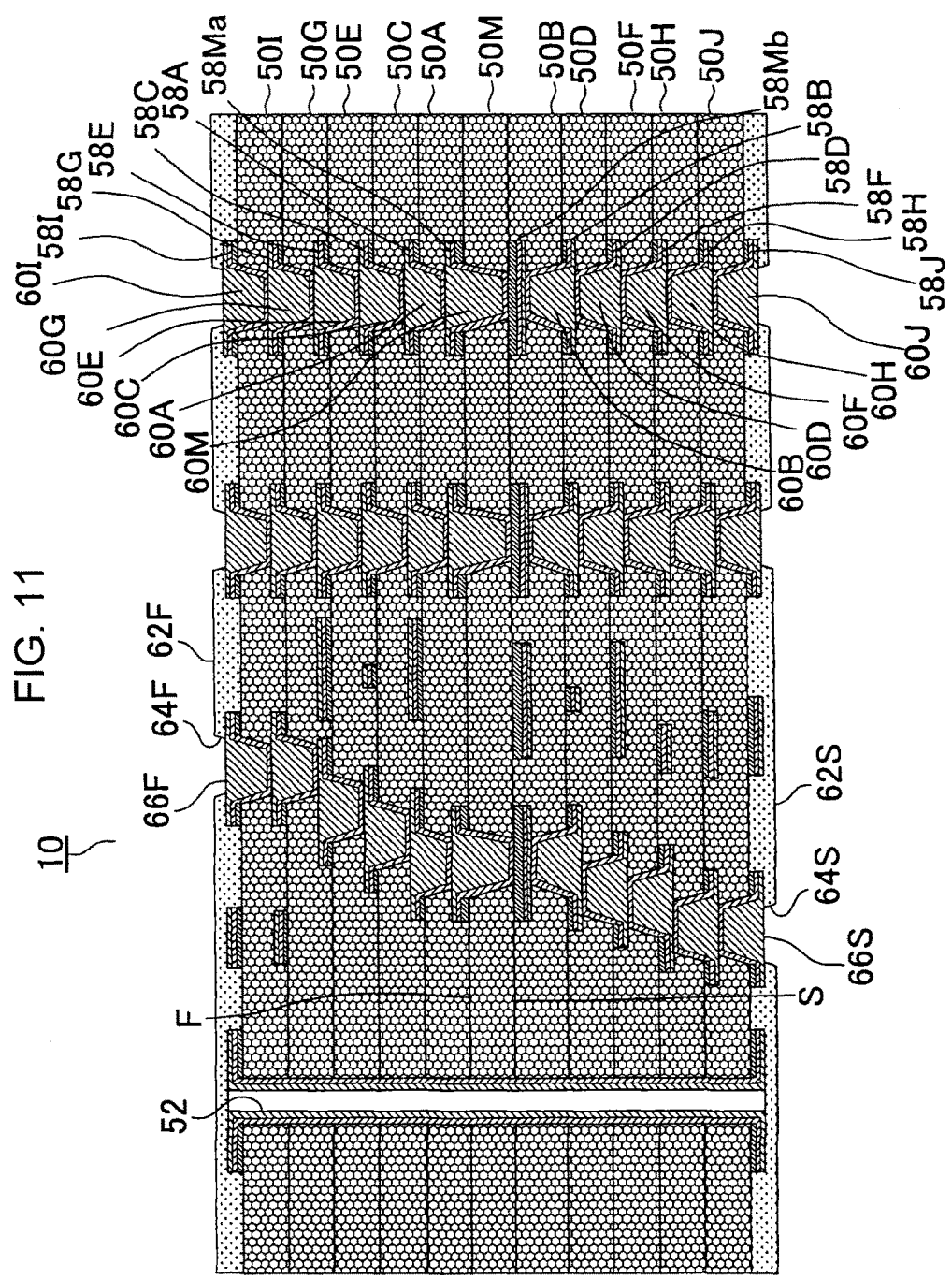
FIG. 11 is a cross-sectional view of a printed wiring board of the first embodiment.

FIG. 11 is a cross-sectional view of a printed wiring board according to a first embodiment before an electronic component is mounted thereon. In printed wiring board 10, interlayer insulation layers (50A, 50C, 50E, 50G, 50I) are laminated on the first-surface (F) side of core insulation layer (50M) positioned in the center, and interlayer insulation layers (50B, 50D, 50F, 50H, 50J) are laminated on the second-surface (S) side. Conductive circuit (58Ma) on first surface (F) of core insulation layer (50M) and conductive circuit (58Mb) on second surface (S) are connected by via conductor (60M).

In interlayer insulation layer (50A) laminated on the first-surface (F) side of core insulation layer (50M), via conductor (60A) is formed to connect conductive circuit (58A) on interlayer insulation layer (50A) to conductive circuit (58Ma) of core insulation layer (50M). In interlayer insulation layer (50C) laminated on interlayer insulation layer (50A), via conductor (60C) is formed to connect conductive circuit (58C) on interlayer insulation layer (50C) to conductive circuit (58A) on interlayer insulation layer (50A). In interlayer insulation layer (50E) laminated on interlayer insulation layer (50C), via conductor (60E) is formed to connect conductive circuit (58E) on interlayer insulation layer (50E) to conductive circuit (58C) on interlayer insulation layer (50C). In interlayer insulation layer (50G) laminated on interlayer insulation layer (50E), via conductor (60G) is formed to connect conductive circuit (58G) on interlayer insulation layer (50G) to conductive circuit (58E) on interlayer insulation layer (50E). In interlayer insulation layer (50I) laminated on interlayer insulation layer (50G), via conductor (60I) is formed to connect conductive circuit (58I) on interlayer insulation layer (50I) to conductive circuit (58G) on interlayer insulation layer (50G). Solder-resist layer (62F) is formed on interlayer insulation layer (50I), and conductive circuit (58I) exposed from opening (64F) of the solder-resist layer works as pad (66F).

In interlayer insulation layer (50B) laminated on the second-surface (S) side of core insulation layer (50M), via conductor (60B) is formed to connect conductive circuit (58B) on interlayer insulation layer (50B) to conductive circuit (58Mb) of core insulation layer (50M). In interlayer insulation layer (50D) laminated on interlayer insulation layer (50B), via conductor (60D) is formed to connect conductive circuit (58D) on interlayer insulation layer (50D) to conductive circuit (58B) on interlayer insulation layer (50B). In interlayer insulation layer (50F) laminated on interlayer insulation layer (50D), via conductor (60F) is formed to connect conductive circuit (58F) on interlayer insulation layer (50F) to conductive circuit (58D) on interlayer insulation layer (50D). In interlayer insulation layer (50H) laminated on interlayer insulation layer (50F), via conductor (60H) is formed to connect conductive circuit (58H) on interlayer insulation layer (50H) to conductive circuit (58F) on interlayer insulation layer (50F). In interlayer insulation layer (50J) laminated on interlayer insulation layer (50H), via conductor (60J) is formed to connect conductive circuit (58J) on interlayer insulation layer (50J) to conductive circuit (58H) on interlayer insulation layer (50H). Solder-resist layer (62S) is formed on interlayer insulation layer (50J), and conductive circuit (58J) exposed from opening (64S) of the solder-resist layer works as pad (66S). Through hole 52 is formed penetrating through interlayer insulation layers (50I, 50G, 50E, 50C, 50A, 50M, 50B, 50D, 50F, 50H, 50J).

Figure 12:
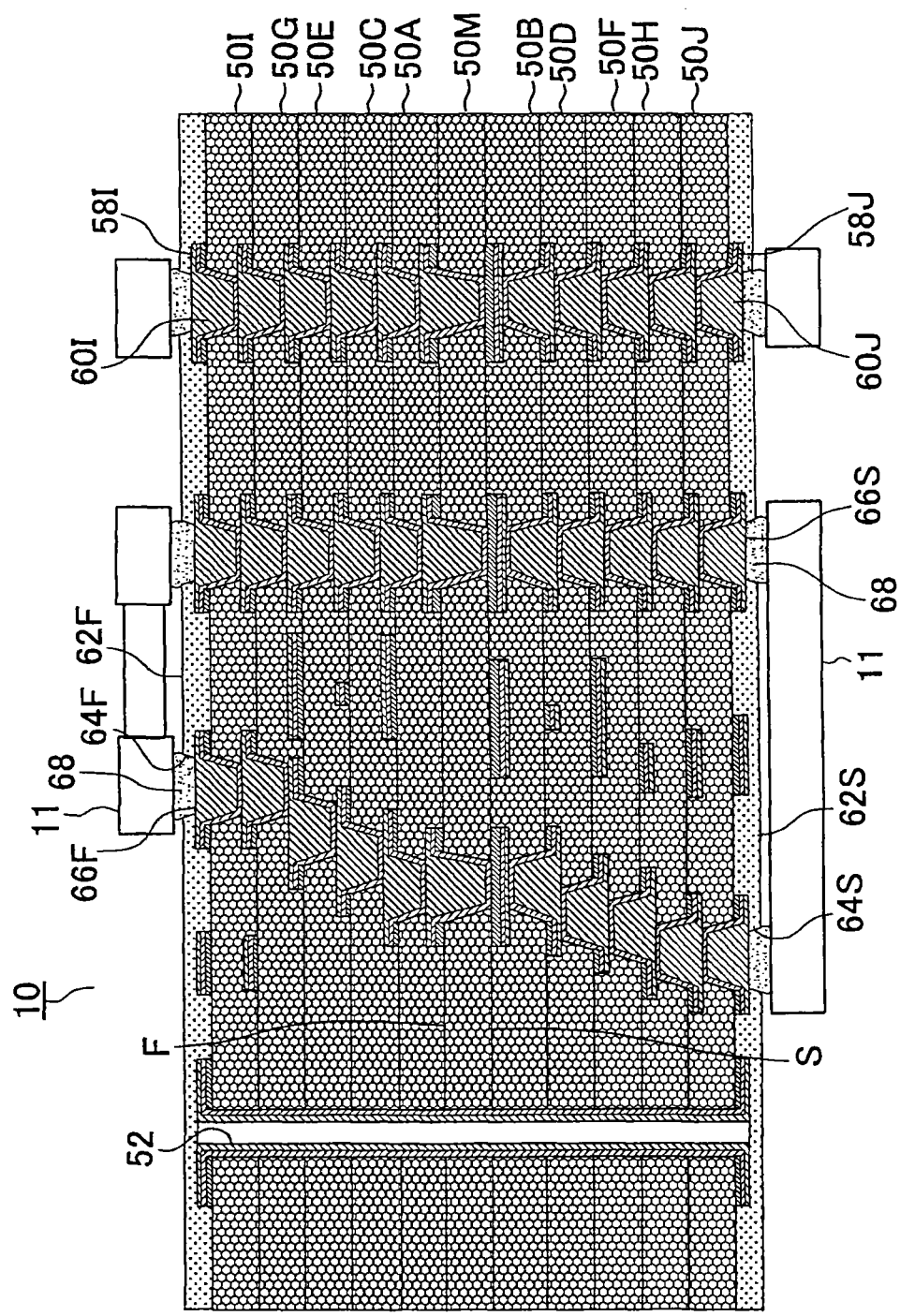
FIG. 12 is a cross-sectional view of a printed wiring board with mounted electronic components in the first embodiment.

FIG. 12 is a cross-sectional view of a printed wiring board with mounted electronic components. On the first-surface (F) side of the printed wiring board, electronic component 11 is mounted through solder 68 provided on pad (66F), and on the second-surface (S) side, electronic component 11 is mounted through solder 68 provided on pad (66S).

Figure 2:
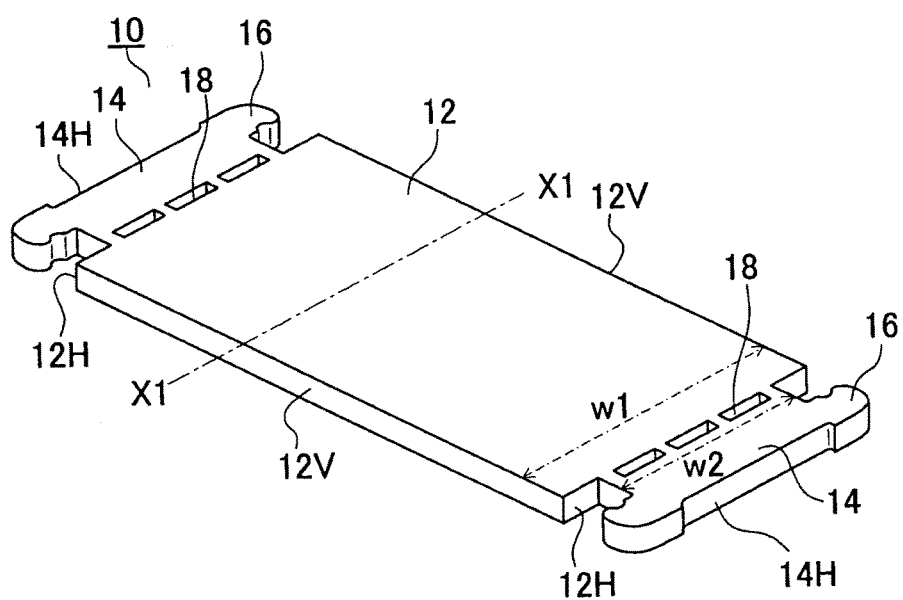
FIG. 2 is a perspective view of a printed wiring board cut out as an individual piece.

FIG. 1 is a plan view of multipiece printed wiring board (10G) where 8×4 printed wiring boards 10 are manufactured. FIG. 2 is a perspective view of printed wiring board 10 cut out into an individual piece. FIG. 11 shows part of the cross section taken at (X1-X1) in FIG. 2. As shown in FIG. 1, printed wiring boards 10 are manufactured inside frame 20 positioned along the periphery of multipiece printed wiring board (10G). As shown in FIG. 2, printed wiring board 10 has rectangular main body 12 structured to have short-side sidewalls (12H) and long-side sidewalls (12V). To each of short-side sidewalls (12H) on either side of the main body, extension piece 14 is attached, extending in a direction along long-side sidewall (12V) of the main body. Extension pieces (14, 14) are formed to face each other by sandwiching the main body, and are each formed to have end wall (edge side) (14H) that is parallel to short-side sidewall (12H) of main body 12. Width (w2) of extension piece 14 is narrower than width (w1) of main body 12, and slits 18 for cutting off the main body are formed between extension piece 14 and main body 12 along short-side sidewall (12H). In each extension piece 14, a pair of U-shaped protruding tabs 16 is formed to protrude in a direction perpendicular to the direction in which the extension piece extends.

Figure 3A:
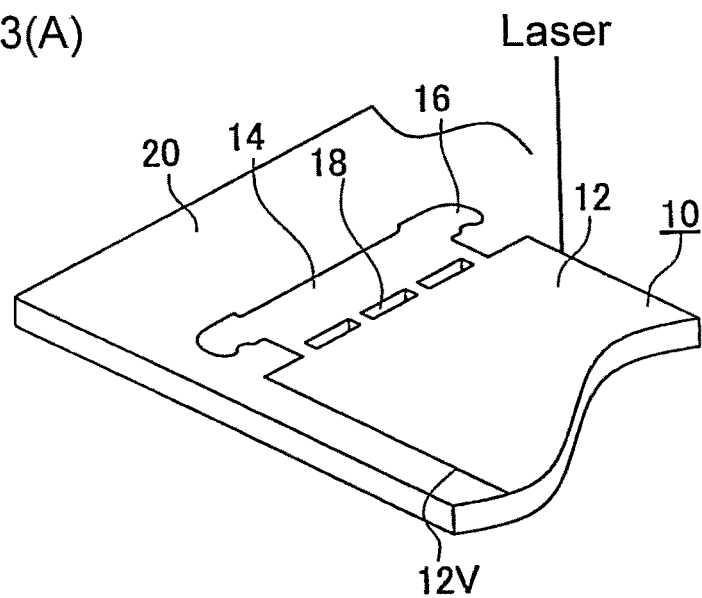
FIGS. 3(A) and 3(B) show perspective views of a printed wiring board under laser processing.
Figure 3B:
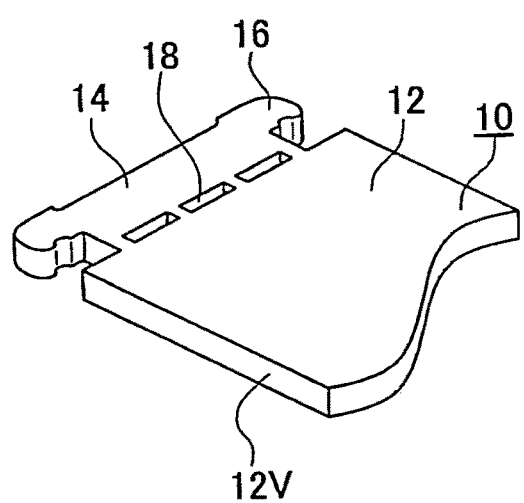

In the first embodiment, when printed wiring board 10 is cut out from multipiece wiring board (10G), a laser is used to cut along the outline of printed wiring board 10 as shown in FIG. 3(A) and an individual piece is cut out as shown in FIG. 3(B). Prior to cutting along the outline of a printed wiring board, slits 18 are formed by a laser.

Figure 4A:
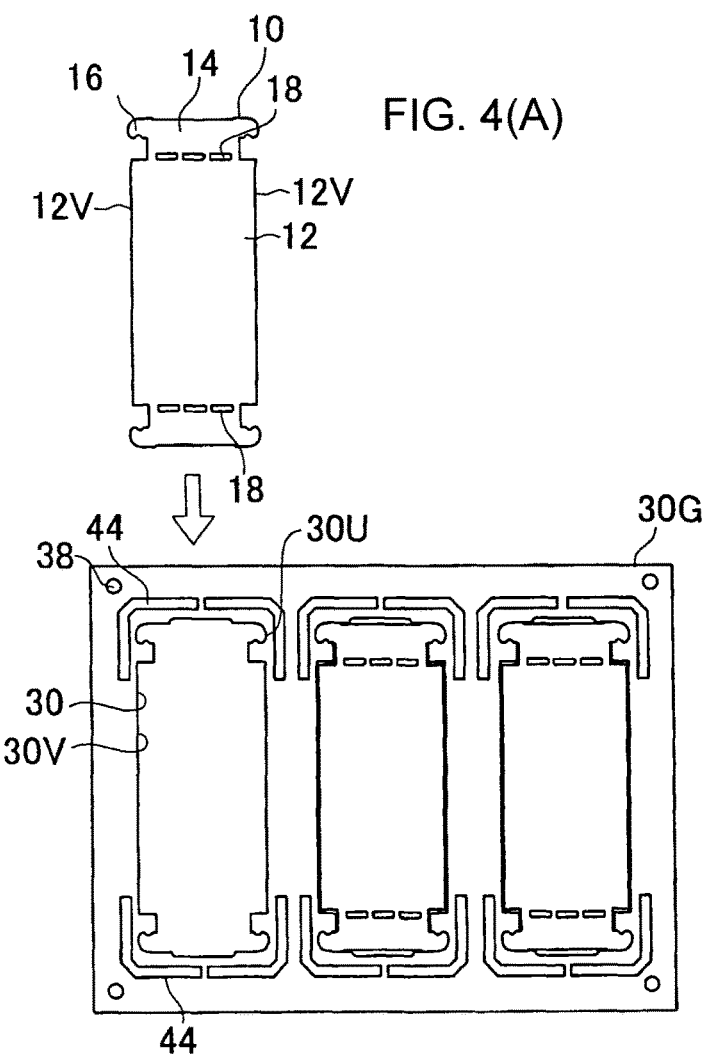
FIGS. 4(A) and 4(B) are a plan view of a metal frame and a plan view of a combined wiring board.

FIG. 4(A) is a plan view of metal frame (30G) made of aluminum. Metal frame (30G) has three accommodation openings 30, each for accommodating a printed wiring board, and alignment holes 38 are formed at the four corners of the frame. On the periphery of opening 30, L-shaped slits 44 are formed to adjust stress.

Figure 4B:
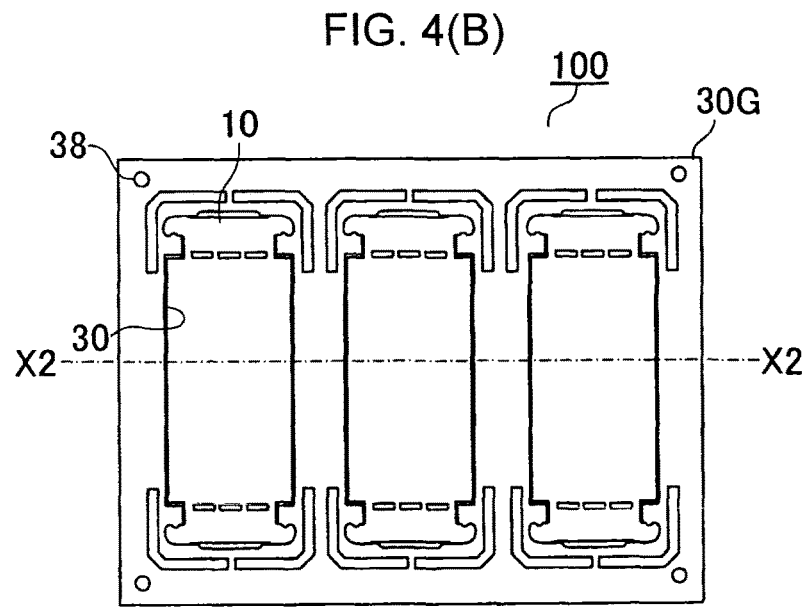

FIG. 4(B) shows a state where printed wiring boards 10 are fixed into all the accommodation openings 30 of metal frame (30G). FIG. 8(A) shows a cross-sectional view of printed wiring board 10 taken at (X2-X2) in FIG. 4(B). Metal frame (30G) is set to have a thickness (t1) of 750 μm, and printed wiring board 10 is set to have a thickness (t2) of 780 μm. Namely, the thickness of the metal frame is less than that of a printed wiring board. In addition, center plane (C1) of metal frame (30G) in a thickness direction corresponds to center plane (C2) of printed wiring board 10 in the thickness direction. Therefore, metal frame (30G) is recessed from upper surface (first surface) (F) of printed wiring board 10, and metal frame (30G) is recessed from lower surface (second surface) (S) of the printed wiring board. The coefficient of thermal expansion along a main surface of metal frame (30G) made of aluminum is 23 ppm/° C., and the coefficient of thermal expansion along a main surface of printed wiring board 10 made of resin is 16 ppm/° C. The thermal expansion coefficient of metal frame (30G) is higher than that of the printed wiring board. The thickness of the metal frame is set to be less than that of a printed wiring board so that a difference in thermal expansion coefficients is adjusted not to cause warping in the printed wiring board. In addition, a printed wiring board is fixed to the frame in such a way that metal frame (30G) is recessed from upper surface (first surface) (F) of printed wiring board 10 and metal frame (30G) is recessed from lower surface (second surface) (S) of printed wiring board 10. Accordingly, when an electronic component is mounted on the printed wiring board, metal frame (30G) does not interfere with the mounting procedure. Aluminum is used as the material for the metal frame in the first embodiment, but copper, stainless steel or the like may also be used as long as its thermal expansion coefficient is higher than that of printed wiring boards.

FIG. 5 shows a state where printed wiring board 10 is fixed to accommodation opening 30 of metal frame (30G). Accommodation opening 30 has long-side sidewall (30V) facing long-side sidewall (12V) of main body 12, short-side first wall (30H) facing short-side sidewall (12H) of main body 12, extension-side sidewall (30Vv) facing extension-side sidewall (14V) of extension piece 14, short-side second wall (30Hh) facing end wall (14H) of extension piece 14, and U-shaped portion (30U) partially abutting protruding tab 16. In the center of short-side second wall (30Hh), recess (30D) is formed. A clearance of less than 1 mm is provided between long-side sidewall (12V) of main body 12 and long-side sidewall (30V), between short-side sidewall (12H) of main body 12 and short-side first wall (30H), and between extension-side sidewall (14V) of extension piece 14 and extension-side sidewall (30Vv). Since printed wiring board 10 is longer in a long-side direction, its expansion is greater in the long-side direction. Thus, a space greater than the above clearance is provided between end wall (14H) of extension piece 14 and recess (30D) so that interference is prevented between opening 30 and end wall (14H). Accordingly, stress on end wall (14H) is suppressed when the printed wiring board undergoes thermal contraction.

Figure 7A:
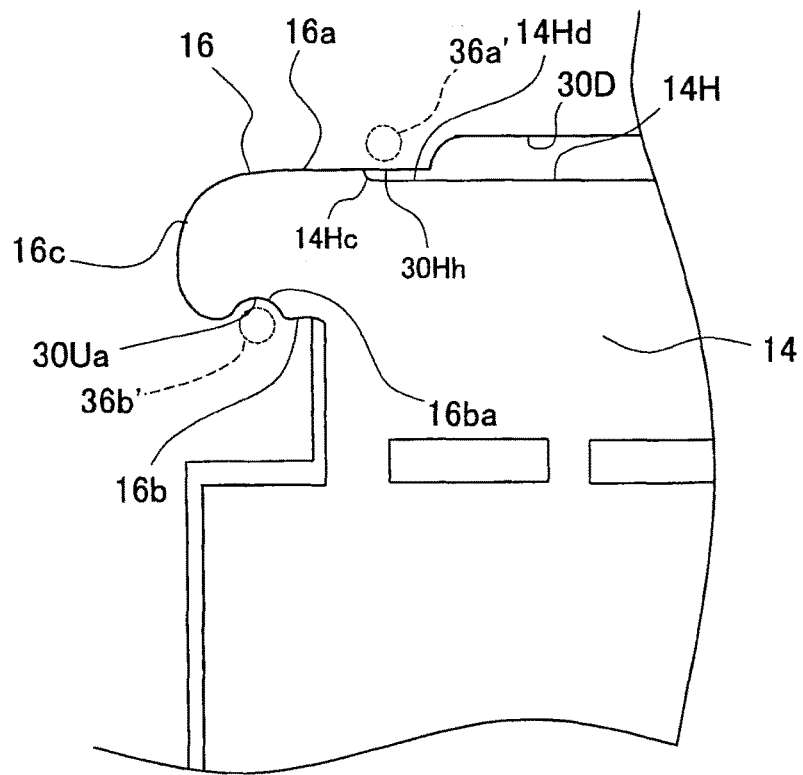
FIGS. 7(A) and 7(B) show enlarged views of an extension piece and a protruding tab in FIG. 6.
Figure 7B:
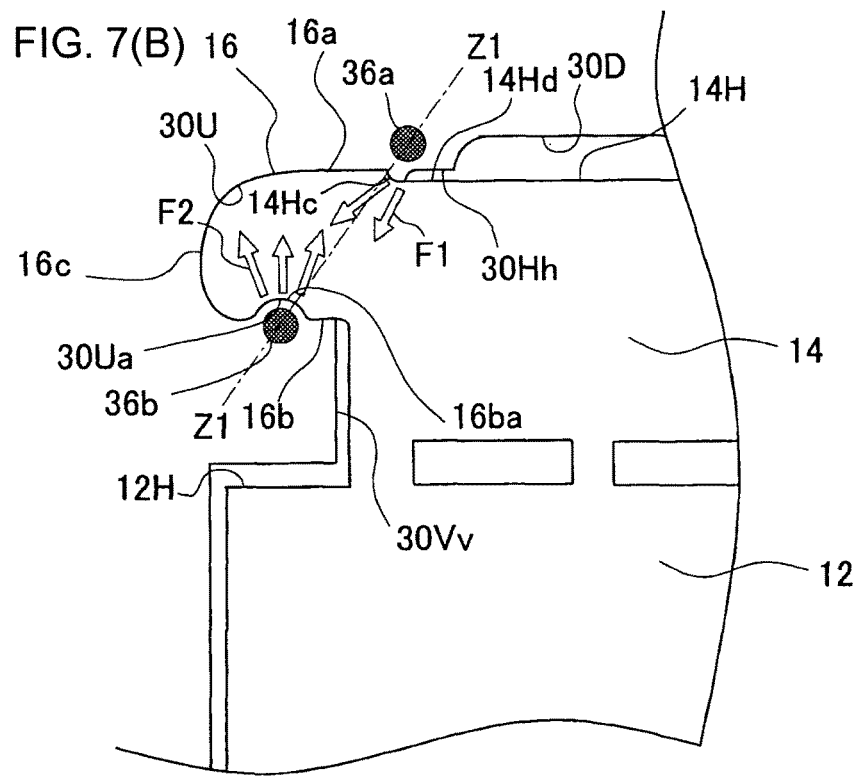

FIG. 7(B) is an enlarged view of extension piece 14 and protruding tab 16 provided for main body 12 of printed wiring board 10 shown in FIG. 5. The periphery of U-shaped protruding tab 16 is composed of first extending portion (16a) extending along end wall (14H) of extension piece 14, second extending portion (16b) positioned opposite first extending portion (16a), and side-edge portion (16c) formed in the extending direction of extension piece 14 to connect first extending portion (16a) and second extending portion (16b). Protruding tab 16 is accommodated in U-shaped portion (30U) of opening 30 in metal frame (30G). First crimped portion (36a) is formed at the base of U-shaped portion (30U) of opening 30, which is at the border between U-shaped portion (30U) and recess (30D). Second crimped portion (36b) is formed at the border of U-shaped portion (30U) and extension-side sidewall (30Vv). First crimped portion (36a) and second crimped portion (36b) cause the sidewall of U-shaped portion (30U) to make contact with and be pressed against the sidewall of protruding tab 16. In the portion where second crimped portion (36b) is formed, arc shape (16ba) is formed in second extending portion (16b) of protruding tab 16 of printed wiring board 10 so as to be recessed into protruding tab 16. Except for arc shape (16ba), second extending portion (16b) is formed to be substantially a straight line parallel to short-side sidewall (12H) of main body 12. Arc shape (16ba) is formed in a circular arc which is set concentric with second crimped portion (36b). Arc shape (30Ua) corresponding to arc shape (16ba) is formed in U-shaped portion (30U). FIG. 7(A) shows metal frame (30G) prior to a crimping process. In the vicinity of first crimping position (36a'), 1-plus mm wide clearance (14Hd) is formed between end wall (14H) of printed wiring board 10 and its opposing short-side second wall (30Hh). Arc shape (14Hc) is formed between a portion of end wall (14H) with clearance (14Hd) and another portion without the clearance. Arc shape (14Hc) is formed closer to protruding tab 16 than first crimping position (36a') is.

Figure 13A:
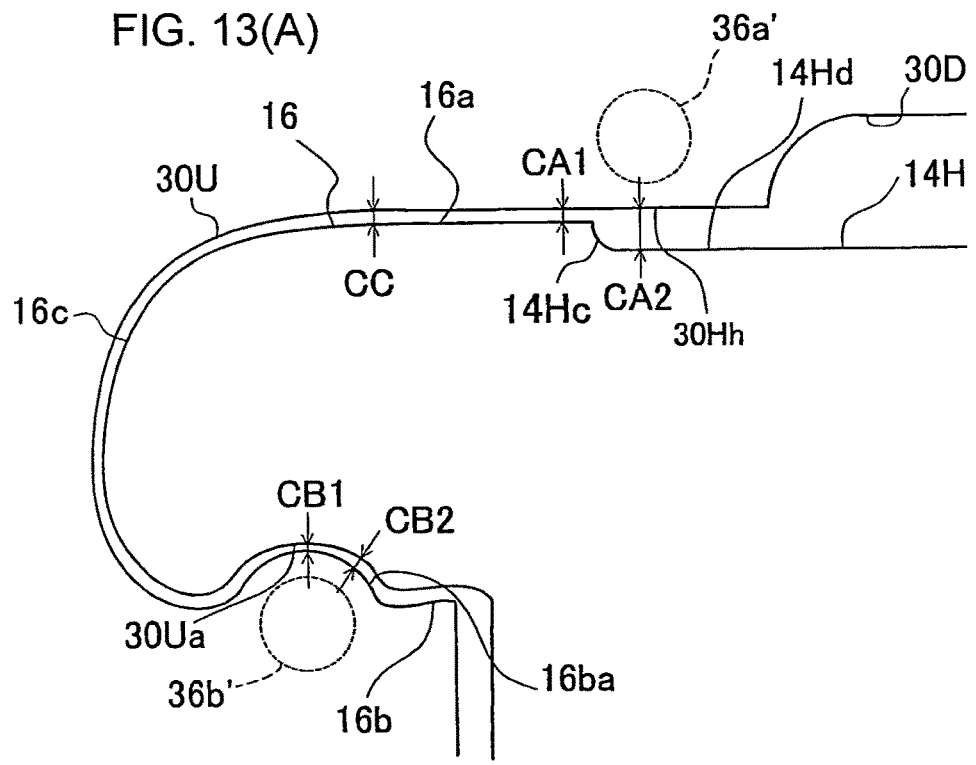
FIGS. 13(A) and 13(B) show enlarged views of a protruding tab in FIG. 7.
Figure 13B:
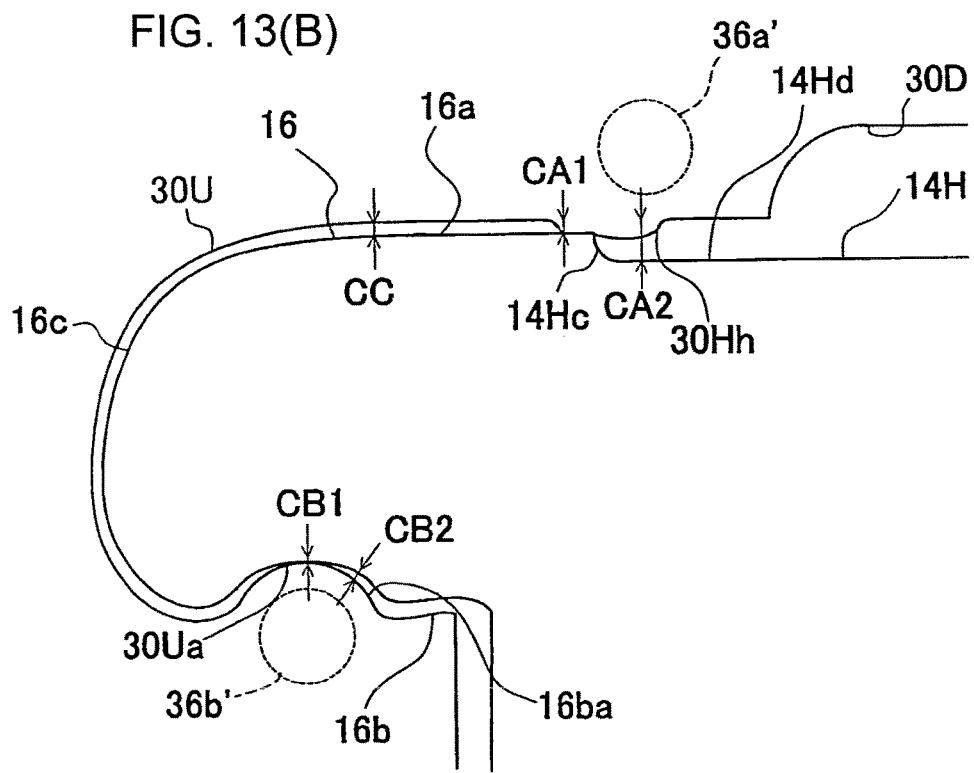
Figure 14:
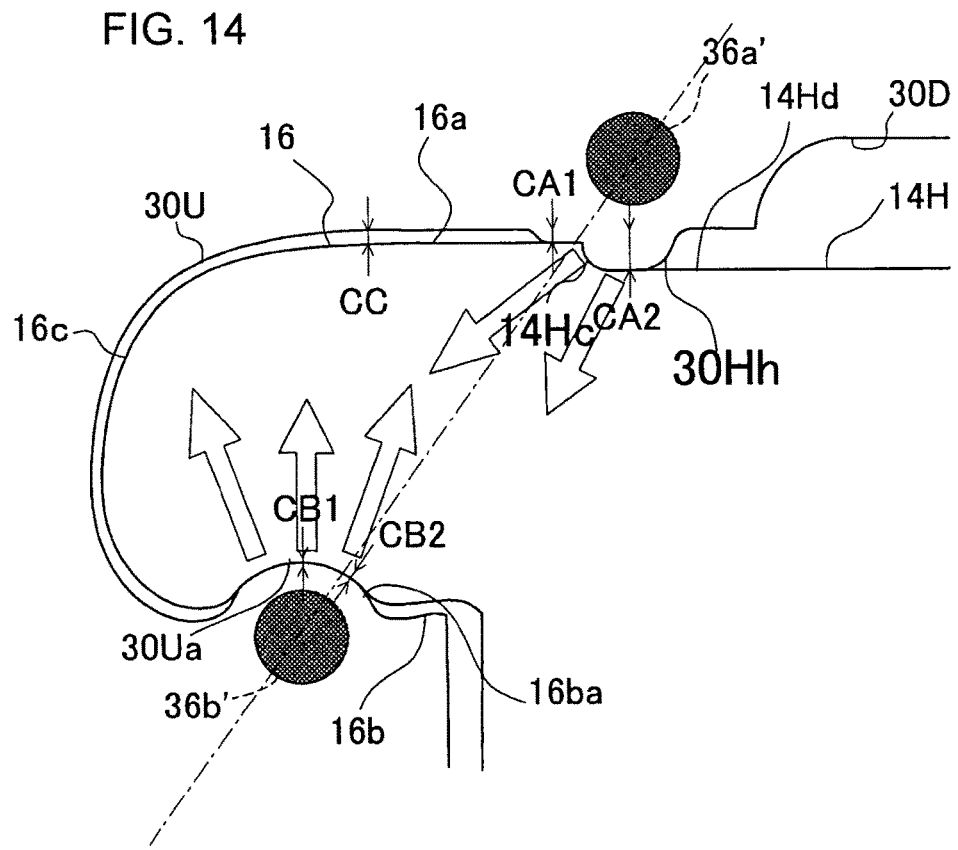
FIG. 14 is an enlarged view of a protruding tab in FIG. 7.

As described above with reference to FIG. 7(A), in the vicinity of first crimping position (36a'), clearance (14Hd) is formed between end wall (14H) of printed wiring board 10 and its opposing short-side second wall (30Hh). Arc shape (14Hc) is formed between a portion of end wall (14H) with clearance (14Hd) and another portion without the clearance. FIG. 13(A) is an enlarged view of protruding tab 16 in FIG. 7(A). Between protruding tab 16 and U-shaped portion (30U), clearance (CC) is formed to have a constant width of a few dozen millimeters. On the side farther from first crimping position (36a') than arc shape (14Hc) above, clearance (CA1) is formed to have the same width as constant clearance (CC) above. In addition, 1-plus mm wide clearance (CA2) is formed between end wall (14H) of printed wiring board 10 and its opposing short-side second wall (30Hh) in the vicinity of first crimping position (36a'). Accordingly, when first crimped portion (36a) is formed and plastic deformation occurs in metal frame (30G), in the portion which is farther from first crimping position (36a') than arc shape (14Hc) and where narrower clearance (CA1) is formed, first extending portion (16a) abuts U-shaped portion (30U), exerting stress toward first extending portion (16a) as shown in FIG. 13(B). Then, at the time first crimped portion (36a) is formed as shown in FIG. 7(B), short-side second wall (30Hh) now abuts clearance (14Hd) as shown in FIG. 14 which is an enlarged view of protruding tab 16 in FIG. 7(B). At that time, stress (F1) is diverted toward arc shape (14Hc) and heads toward second crimped portion (36b). Thus, stress is unlikely to be exerted toward main body 12.

Figure 15A:
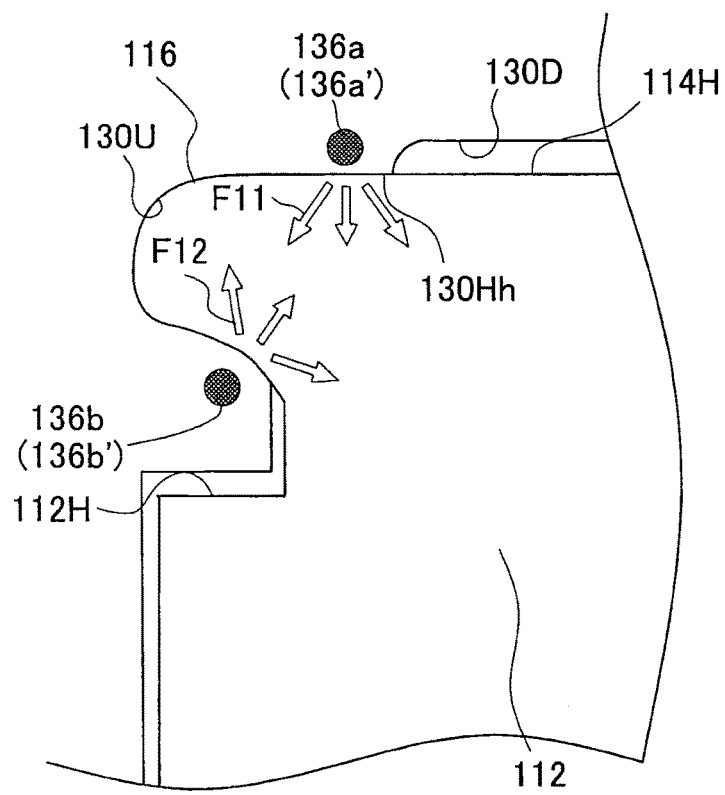
FIG. 15(A)-15(C) show schematic views of stress exerted on a printed wiring board according to a comparative example.
Figure 15B:
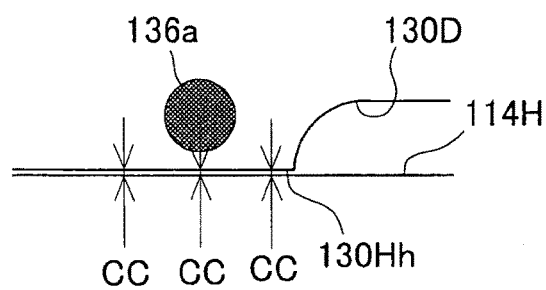

FIG. 15(A) shows stress exerted on a printed wiring board of a comparative example. In the comparative example, end wall (114H) formed to be parallel to short-side sidewall (112H) of main body 112 faces the accommodation opening with constant clearance (CC) as shown in an enlarged view of first crimping position (136a') in FIG. 15(B). Thus, when first crimped portion (136a) is formed, portions of end wall (114H) abut portions of short-side second wall (130Hh) of opening 130 without any time lag. Accordingly, part of stress (F11) from first crimped portion (136a) heads toward main body 112, causing stress generated during crimping to be exerted on main body 112.

As shown in FIG. 7(B), second crimped portion (36b) is formed in a portion facing second extending portion (16b) of protruding tab 16 which extends sideways from extension piece 14. Since second extending portion (16b) is formed opposite short-side sidewall (12H) of main body 12 with second crimped portion (36b) positioned in between, stress (F2) exerted from second crimped portion (36b) onto second extending portion (16b) is unlikely to affect main body 12. FIG. 13(A) is an enlarged view of protruding tab 16 in FIG. 7(A). Between arc shape (16ba) of protruding tab 16 and arc shape (30Ua) of U-shaped portion (30U), relatively narrow clearance (CB1) is formed on the extension-piece 14 side of second crimping position (36b') seen from main body 12 (in a vertical direction in the view), and relatively wider clearance (CB2) is formed diagonally from second crimping position (36b'). When second crimped portion (36b) is formed and plastic deformation occurs in metal frame (30G), arc shape (16ba) abuts arc shape (30Ua) in a portion where narrower clearance (CB1) is formed as shown in FIG. 13(B), causing stress to be exerted in a vertical direction in the view. Then, at the time second crimped portion (36b) is formed as shown in FIG. 7(B), arc shape (16ba) now abuts arc shape (30Ua) in the portion where wider clearance (CB2) is formed as shown in FIG. 14, which is an enlarged view of protruding tab 16 in FIG. 7(B). Accordingly, stress is exerted diagonally as shown in the view. Moreover, in the portion where second crimped portion (36b) is formed, arc shape (16ba) is formed in second extending portion (16b) of protruding tab 16, and arc shape (30Ua) corresponding to arc shape (16ba) is formed in U-shaped portion (30U). Thus, stress is dispersed uniformly along arc shape (16ba), and is unlikely to affect main body 12.

Figure 15C:
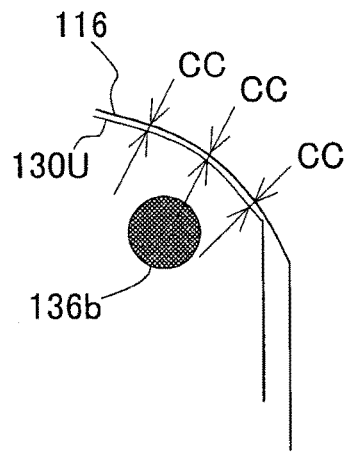

FIG. 15 shows stress exerted on a printed wiring board of a comparative example. In the comparative example, protruding tab 116 faces U-shaped portion (130U) with constant clearance (CC) between them as shown in an enlarged view of second crimping position (136b') in FIG. 15c. Accordingly, when second crimped portion (136b) is formed, portions of protruding tab 116 abut portions of U-shaped portion (130U) without any time lag. Thus, part of stress (F12) from second crimped portion (136b) heads toward main body 112, causing stress to be exerted on main body 112 during the crimping process.

As shown in FIG. 7(B), stress from first crimped portion (36a) mainly heads toward arc shape (14Hc). Thus, with respect to line (Z1-Z1) connecting the center of first crimped portion (36a) and the center of second crimped portion (36b), the degree of deformation caused by crimping is greater in the outer region of the line (left side in the view) than in the inner region of the line (right side in the view). The stress from second crimpled portion (36b) is dispersed uniformly along arc shape (16ba). However, since line (Z1-Z1) intersects with arc shape (16ba) diagonally toward the left in the view, the portion to the left of line (Z1-Z1) (outer region from the line) is longer than the portion to the right of line (Z1-Z1) (inner region from the line). Therefore, the degree of deformation caused by crimping is greater in the outer region than in the inner region with respect to line (Z1-Z1). As described, since the degree of deformation caused by crimping is greater in the outer region than in the inner region, stress heading toward main body 12 is reduced in the first embodiment.

FIG. 9(A) is a cross-sectional view of crimping tool 300 to conduct a crimping process on a printed wiring board. Crimping tool 300 has lower die 210 and upper die 310. Lower die 210 has base portion 211 and support plate 218. Support plate 218 is supported to be vertically movable with respect to base portion 211. Punches 216 for crimping are provided for base portion 211, and penetrating holes (218h) for punches 216 to pass through are formed in support plate 218. In the central portion of support plate 218, recessed portion (218d) is formed so as not to exert force on a printed wiring board during crimping. Printed wiring board 10 is placed on recessed portion (218d), and metal frame (30G) is placed on support plate 218.

Upper die 310 has base portion 311 and support plate 318. Support plate 318 is supported to be vertically movable with respect to base portion 311. Punches 316 for crimping are provided for base portion 311, and penetrating holes (318h) for punches 316 to pass through are formed in support plate 318. Recessed portion (318d) is formed in the central portion of support plate 318.

FIG. 9(B) is a view showing a state where upper die 310 is pressed against lower die 210, punches 316 of upper die 310 are pressed against the upper surface of metal frame (30G), and punches 216 of lower die 210 are pressed against the lower surface of metal frame (30G). In each of three accommodation openings 30 of metal frame (30G) shown in FIG. 4(B), first crimped portion (36a) and second crimped portion (36b) are formed simultaneously as shown in FIG. 5. Accordingly, combined wiring board 100 made up of printed wiring boards 10 and metal frame (30G) is completed, ready for a reflow process. During that process, stress from crimping is not exerted on the main body of the printed wiring board as described above.

In a combined wiring board of the first embodiment, since first and second crimped portions (36a, 36b) are formed simultaneously in each of three accommodation openings 30, accurate alignment of printed wiring boards is achieved with respect to metal frame (30G). Here, compared with a combined wiring board where an adhesive agent or the like is used for fixing printed wiring boards to the frame, crimping is conducted simultaneously on all the printed wiring boards. Thus, alignment with metal frame (30G) is accurate, and positional shifting among printed wiring boards is minimized. Moreover, compared with an alignment method using an adhesive agent, since the steps for filling and curing the adhesive agent are not required, there are fewer manufacturing steps. Thus, productivity is enhanced and the manufacturing cost of fixing printed wiring boards to a metal frame is reduced.

Figure 6A:
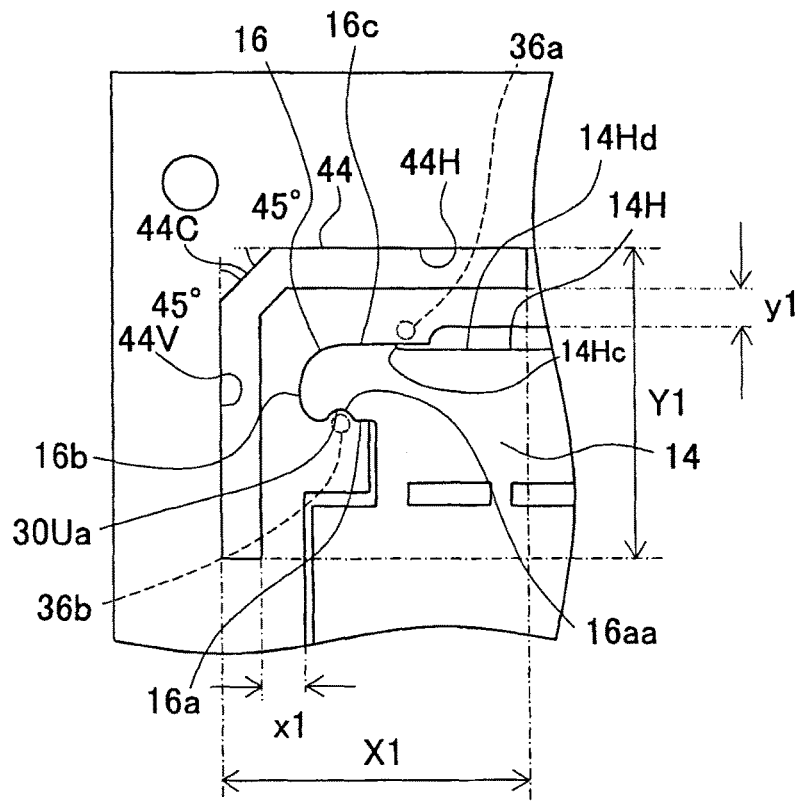
FIGS. 6(A) and 6(B) show enlarged views of an L-shaped slit in FIG. 5.
Figure 6B:
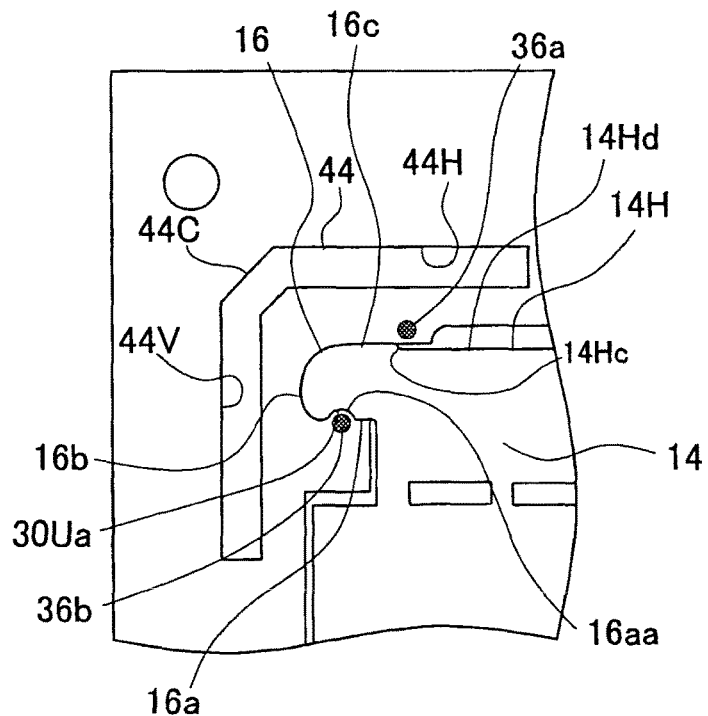

FIG. 6 is an enlarged view of L-shaped slit 44. L-shaped slit 44 has first straight portion (44H) formed in a long-side direction of metal frame (30G), second straight portion (44V) formed in a short-side direction of metal frame (30G) to be perpendicular to the first straight portion, and third straight portion (44C) positioned between the first straight portion and the second straight portion. The angle made by an extension line of first straight portion (44H) and third straight portion (44C) is 45 degrees, and the angle made by an extension line of second straight portion (44V) and third straight portion (44C) is approximately 45 degrees. Length (X1) (length of L-shaped slit in a direction of X) obtained by adding the length of first straight portion (44H) and the length of a component of third straight portion (44C) extended in a direction along the first straight portion is 18 mm. Length (Y1) (length of L-shaped slit in a direction of Y) obtained by adding the length of second straight portion (44V) and the length of a component of third straight portion (44C) extended in a direction along the second straight portion is 18 mm. The length of first straight portion (44H) is equal to the length of second straight portion (44V).

Extension piece 14 of printed wiring board 10 according to the first embodiment is structured to have a pair of protruding tabs 16 in substantially a U-shape with a width increasing sideways, and first crimped portion (36a) and second crimped portion (36b) are formed at the base of each protruding tab 16. First crimped portion (36a) and second crimped portion (36b) cause the sidewall of U-shaped portion (30U) to make contact with and be pressed against the sidewall of protruding tab 16. Except for the portions of protruding tab 16 fixed by first crimped portion (36a) and second crimped portion (36b), the sidewalls of the printed wiring board are not in contact with the sidewalls of the accommodation opening. There is a clearance between extension-side sidewall (14V) of main body 20 and accommodation opening 30. On crimped portion (36a) formed at the edge of end wall (14H) of extension piece 14, stress caused by thermal expansion during a reflow process is exerted along a long side of a printed wiring board, but L-shaped slit 44 is formed in a direction extending along the long side of the printed wiring board from which stress is exerted. Meanwhile, on each of first crimped portion (36a) and second crimped portion (36b), stress caused by thermal expansion during a reflow process is exerted along a short side of the printed wiring board, but L-shaped slit 44 is formed in a direction extending along the short side of the printed wiring board from which stress is exerted. Accordingly, stress is mitigated uniformly in the printed wiring board during a reflow process, and thus the printed wiring board is unlikely to warp.

In the first embodiment, at a temperature for solder reflow, the frame section made of metal frame (30G) is preferred to have a rigidity higher than that of piece sections made of printed wiring boards 10 and so on.

In a state where each printed wiring board 10 is fixed to accommodation opening 30 of metal frame (30G) shown in FIG. 5, solder printing is conducted, and electronic components are positioned and mounted in a reflow oven. Since the reflow temperature reaching almost 200° C. exceeds the Tg (glass transition temperature) of the resin in a printed wiring board, warping tends to occur in the printed wiring board due to the weight of a mounted electronic component and the residual stress in the wiring board. In printed wiring board 10 of the first embodiment fixed to metal frame (30G), stress toward the center of printed wiring board 10 is generated together with stress from the weight of electronic component 11 as shown in FIG. 8(B). However, since the coefficient of thermal expansion along a main surface of metal frame (30G) is higher than that of printed wiring board 10 as described above, expansion of metal frame (30G) in a planar direction is greater than that of printed wiring board 10. Thus, on printed wiring board 10 fixed into accommodation opening 30, stress (F3) toward the periphery is exerted so as to cancel out the aforementioned stress toward the center of printed wiring board 10. Accordingly, warping is unlikely to occur in the printed wiring board during the reflow process.

As shown in FIG. 5, one extension piece 14 is formed along each of short-side sidewall (14H) of rectangular main body 12 to face each other by sandwiching main body 12 between them. Main body 12 and extension piece 14 are connected by bridge portion 19 made of slits 18.

FIG. 10(A) shows metal frame (300) after bridge portion 19 between slits 18 is cut and main body 12 of a printed wiring board shown in FIG. 10(B) is separated. Extension piece 14 of the printed wiring board remains on the metal-frame (300) side. In the first embodiment, since slits 18 are formed in advance, it is easier to separate main body 12 of a printed wiring board.

In a multipiece wiring-board accommodation kit in which an adhesive agent is injected in a portion to connect a piece wiring board and an accommodation hole of the frame, an adhesive agent capable of adhering different materials to each other is used. Also, additional steps of filling and curing the adhesive agent decrease productivity. Moreover, since each wiring board is individually fixed into an accommodation hole, significant positional shifting is thought to be caused among wiring boards, resulting in lower yield in later procedures.

A combined wiring board according to an embodiment of the present invention and a method for manufacturing such a combined wiring board exhibit high productivity.

A method for manufacturing a combined wiring board according to an embodiment of the present application includes preparing wiring boards, preparing a metal frame having openings to accommodate the wiring boards, positioning wiring boards in openings of the metal frame, and bonding sidewalls of the wiring boards and sidewalls of the openings of the metal frame by plastic deformation caused in predetermined portions of the metal frame. A sidewall of a wiring board is formed to have a wider-space portion and a narrower-space portion between its opposing sidewall of an opening of the metal frame. When plastic deformation occurs, the sidewall of the opening in the metal frame abuts the narrowed-space portion of the sidewall of the wiring board first, and then abuts the wider-space portion later.

In the method for manufacturing a combined wiring board of the present application, wiring boards are fixed to a metal frame by plastic deformation caused in the metal frame. Thus, unlike a method using an adhesive agent, steps for filling and curing an adhesive agent are not required, and the number of processing steps is smaller. Accordingly, productivity is enhanced and the manufacturing cost of fixing wiring boards to a metal frame is reduced. Compared with a method where multiple wiring boards are fixed in their respective openings using an adhesive agent, since a plastic deformation process is conducted simultaneously on multiple wiring boards, accurate alignment with the metal frame is achieved for all the wiring boards, while positional shifting among wiring boards is minimized.

In a method for manufacturing a combined wiring board according to an embodiment of the present invention, a curved surface is formed to create a wider space and a narrower space in a portion where the metal frame is set to abut a wiring board when plastic deformation occurs. When plastic deformation occurs, the narrower-space portion of a wiring board abuts the sidewall of an opening in the metal frame before the wider-space portion does. Thus, stress caused by plastic deformation is dispersed in different directions, and concentration of stress in a specific direction of the wiring board is thereby prevented. For example, by forming an arc shape in a U-shaped portion of the metal frame facing a side of the main body, stress caused by plastic deformation—stress that would otherwise be exerted on the wiring board—will be dispersed toward the protruding tab. Thus, stress is unlikely to be exerted on the main body. Accordingly, when a wiring board is fixed to a metal frame using plastic deformation, stress is unlikely to be exerted on the main body of the wiring board.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a combined wiring board, comprising:
   preparing a plurality of wiring boards;
   preparing a metal frame having a plurality of opening portions configured to accommodate the plurality of wiring boards, respectively;
   positioning the wiring boards in the opening portions of the metal frame, respectively; and
   forming a plurality of crimped portions in the metal frame by plastic deformation such that the sidewalls of the wiring boards bond to sidewalls of the opening portions in the metal frame,
   wherein the preparing of the wiring boards includes forming the sidewalls of the wiring boards such that when the wiring boards are positioned in the opening portions of the metal frame, the sidewalls of the wiring boards form wide-space portions and narrow-space portions with respect to the sidewalls of the opening portions in the metal frame, the forming of the crimped portions includes generating the plastic deformation such that the sidewalls of the opening portions in the metal frame abut the narrow-space portions of the sidewalls of the wiring boards before the wide-space portions of the sidewalls of the wiring boards, each of the wiring boards has a main body portion, a plurality of extension portions formed on short sides of the main body portion and extending in a longitudinal direction of the main body portion, respectively, and a plurality of protruding portions protruding from the extension portions perpendicular to the longitudinal direction of the main body portion, the extension portions have widths which are shorter than the short sides of the main body portion, and each of the opening portions in the metal frame has a plurality of U-shaped portions configured to accommodate the protruding portions of each of the wiring boards, respectively, such that the sidewalls of the wiring boards bond to the sidewalls in the U-shaped portions of the opening portions in the metal frame.

2. A method for manufacturing a combined wiring board according to claim 1, wherein the preparing of the wiring boards includes forming the sidewalls of the wiring boards such that the sidewalls of the wiring boards have arc-shaped portions which are recessed toward the wiring boards.

3. A method for manufacturing a combined wiring board according to claim 2, wherein the forming of the crimped portions includes forming the crimped portions such that the sidewalls of the opening portions of the metal frame abut the arc-shaped portions of the sidewalls of the wiring boards and that linear portions of the sidewalls of the metal frame abut linear portions of the sidewalls of the wiring boards adjacent to the arc-shaped portions.

4. A method for manufacturing a combined wiring board according to claim 2, wherein the wide-space portions of the sidewalls of the wiring boards have arc-shaped curved surfaces, and the narrow-space portions of the sidewalls of the wiring boards have arc-shaped curved surfaces.

5. A method for manufacturing a combined wiring board according to claim 4, wherein the forming of the crimped portions includes forming the crimped portions such that the sidewalls of the opening portions of the metal frame abut the arc-shaped portions of the sidewalls of the wiring boards and that linear portions of the sidewalls of the metal frame abut linear portions of the sidewalls of the wiring boards adjacent to the arc-shaped portions.

6. A method for manufacturing a combined wiring board according to claim 1, wherein the wide-space portions of the sidewalls of the wiring boards have arc-shaped curved surfaces, and the narrow-space portions of the sidewalls of the wiring boards have arc-shaped curved surfaces.

7. A method for manufacturing a combined wiring board according to claim 1, wherein the forming of the crimped portions includes forming the crimped portions such that two crimped portions are positioned to sandwich a corner portion of each of the wiring boards.

8. A method for manufacturing a combined wiring board according to claim 1, wherein the forming of the crimped portions comprises forming the crimped portions in the metal frame such that the sidewalls of the wiring boards simultaneously bond to the sidewalls of the opening portions in the metal frame.

9. A method for manufacturing a combined wiring board, comprising:
preparing a plurality of wiring boards;
preparing a metal frame having a plurality of opening portions configured to accommodate the plurality of wiring boards, respectively;
positioning the wiring boards in the opening portions of the metal frame, respectively; and
forming a plurality of crimped portions in the metal frame by plastic deformation such that the sidewalls of the wiring boards bond to sidewalls of the opening portions in the metal frame,
wherein the preparing of the wiring boards includes forming the sidewalls of the wiring boards such that when the wiring boards are positioned in the opening portions of the metal frame, the sidewalls of the wiring boards form wide-space portions and narrow-space portions with respect to the side walls of the opening portions in the metal frame, the forming of the crimped portions includes generating the plastic deformation such that the sidewalls of the opening portions in the metal frame abut the narrow-space portions of the sidewalls of the wiring boards before the wide-space portions of the sidewalls of the wiring boards, the wide-space portions of the sidewalls of the wiring boards have arc-shaped curved surfaces, the narrow-space portions of the sidewalls of the wiring boards have arc-shaped curved surfaces, each of the wiring boards has a main body portion, a plurality of extension portions formed on short sides of the main body portion and extending in a longitudinal direction of the main body portion, respectively, and a plurality of protruding portions protruding from the extension portions perpendicular to the longitudinal direction of the main body portion, the extension portions have widths which are shorter than the short sides of the main body portion, and each of the opening portions in the metal frame has a plurality of U-shaped portions configured to accommodate the protruding portions of each of the wiring boards, respectively, such that end sides of the extension portions form the wide-space portions of the sidewalls of the wiring boards and that the U-shaped portions form the narrow-space portions of the sidewalls of the wiring boards.

10. A method for manufacturing a combined wiring board according to Claim 9, wherein the forming of the crimped portions comprises forming the crimped portions in the metal frame such that the sidewalls of the wiring boards simultaneously bond to the sidewalls of the opening portions in the metal frame.

11. A method for manufacturing a combined wiring board according to claim 9, wherein the preparing of the wiring boards includes forming the sidewalls of the wiring boards such that the sidewalls of the wiring boards have arc-shaped portions which are recessed toward the wiring boards.

12. A method for manufacturing a combined wiring board according to claim 11, wherein the forming of the crimped portions includes forming the crimped portions such that the sidewalls of the opening portions of the metal frame abut the arc-shaped portions of the sidewalls of the wiring boards and that linear portions of the sidewalls of the metal frame abut linear portions of the sidewalls of the wiring boards adjacent to the arc-shaped portions.

13. A method for manufacturing a combined wiring board according to claim 11, wherein the wide-space portions of the sidewalls of the wiring boards have arc-shaped curved surfaces, and the narrow-space portions of the sidewalls of the wiring boards have arc-shaped curved surfaces.

14. A method for manufacturing a combined wiring board according to claim 9, wherein the forming of the crimped portions includes forming the crimped portions such that two crimped portions are positioned to sandwich a corner portion of each of the wiring boards.

* * * * *